(12) United States Patent
Takahashi et al.

(10) Patent No.: US 11,414,528 B2
(45) Date of Patent: Aug. 16, 2022

(54) THERMOSETTING RESIN COMPOSITION, PREPREG, METAL-CLAD LAMINATE, PRINTED WIRING BOARD, FILM WITH RESIN, AND METAL FOIL WITH RESIN

(71) Applicant: PANASONIC INTELLECTUAL PROPERTY MANAGEMENT CO., LTD., Osaka (JP)

(72) Inventors: Ryuji Takahashi, Fukushima (JP); Shimpei Obata, Osaka (JP); Yasunori Ambe, Fukushima (JP); Tomo Muguruma, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 169 days.

(21) Appl. No.: 16/757,677

(22) PCT Filed: Oct. 12, 2018

(86) PCT No.: PCT/JP2018/038155
§ 371 (c)(1),
(2) Date: Apr. 20, 2020

(87) PCT Pub. No.: WO2019/082698
PCT Pub. Date: May 2, 2019

(65) Prior Publication Data
US 2020/0332078 A1      Oct. 22, 2020

(30) Foreign Application Priority Data

Oct. 25, 2017      (JP) .............................. JP2017-206638

(51) Int. Cl.
*C08J 5/24*      (2006.01)
*C08L 61/06*      (2006.01)
(Continued)

(52) U.S. Cl.
CPC .................. *C08J 5/24* (2013.01); *B32B 5/02* (2013.01); *B32B 15/08* (2013.01); *B32B 15/20* (2013.01);
(Continued)

(58) Field of Classification Search
CPC ...................................................... B32B 15/08
See application file for complete search history.

(56) References Cited

U.S. PATENT DOCUMENTS

2007/0264438 A1   11/2007   Kawai
2012/0308832 A1   12/2012   Satou et al.
(Continued)

FOREIGN PATENT DOCUMENTS

CN      103298882      9/2013
CN      105008425      10/2015
(Continued)

OTHER PUBLICATIONS

Office Action issued in CN Patent Application No. 201880067404.9, dated Sep. 3, 2021, English translation.
Official Communication issued in International Patent Application No. PCT/JP2018/038155, dated Dec. 25, 2018, along with an English translation thereof.

*Primary Examiner* — Ian A Rummel
(74) *Attorney, Agent, or Firm* — Greenblum & Bernstein, P.L.C.

(57) ABSTRACT

A thermosetting resin composition contains a thermosetting resin and an inorganic filler. The thermosetting resin includes a curing agent. A 3 mass % methyl ethyl ketone solution of the curing agent has a Gardner color scale of 15 or more. The content of the curing agent accounts for 10 mass % or more of a total solid content of the thermosetting resin composition.

11 Claims, 4 Drawing Sheets

(51) Int. Cl.
    *C08G 8/08*           (2006.01)
    *H05K 1/03*           (2006.01)
    *B32B 15/08*          (2006.01)
    *B32B 15/20*          (2006.01)
    *B32B 5/02*           (2006.01)

(52) U.S. Cl.
    CPC ................ *C08G 8/08* (2013.01); *C08L 61/06* (2013.01); *H05K 1/0373* (2013.01); *B32B 2260/021* (2013.01); *B32B 2260/046* (2013.01); *B32B 2262/101* (2013.01); *B32B 2307/304* (2013.01); *B32B 2307/3065* (2013.01); *C08J 2361/06* (2013.01); *C08J 2433/04* (2013.01); *C08L 2201/02* (2013.01); *C08L 2205/03* (2013.01); *C08L 2207/53* (2013.01)

(56) References Cited

U.S. PATENT DOCUMENTS

| | | |
|---|---|---|
| 2013/0131215 A1 | 5/2013 | Satou |
| 2013/0319609 A1 | 12/2013 | Shim et al. |
| 2014/0102623 A1 | 4/2014 | Kawai et al. |
| 2016/0017141 A1 | 1/2016 | Matsumoto et al. |

FOREIGN PATENT DOCUMENTS

| | | |
|---|---|---|
| JP | 06-128357 | 5/1994 |
| JP | 2001-261785 | 9/2001 |
| JP | 2012-097283 | 5/2012 |
| JP | 2014-065829 | 4/2014 |
| WO | 2011/096273 | 8/2011 |
| WO | 2012/017816 | 2/2012 | ized as the thicknesses of substrates have been further reduced lately, and is still difficult to solve even when the substrate is made of the cured product of Patent Literature 1, for example.

THERMOSETTING RESIN COMPOSITION, PREPREG, METAL-CLAD LAMINATE, PRINTED WIRING BOARD, FILM WITH RESIN, AND METAL FOIL WITH RESIN

CROSS-REFERENCE TO RELATED APPLICATIONS

This application is a National Stage of International Application No. PCT/JP2018/038155 filed Oct. 12, 2018, claiming priority to Japanese Patent Application No. 2017-206638, filed Oct. 25, 2017, the contents of each application are hereby incorporated by reference in their entirety.

TECHNICAL FIELD

The present disclosure generally relates to a thermosetting resin composition, a prepreg, a metal-clad laminate, and a printed wiring board. More particularly, the present disclosure relates to a thermosetting resin composition containing a thermosetting resin and an inorganic filler, a prepreg including a semi-cured product of the thermosetting resin composition, a metal-clad laminate including a cured product of the prepreg, and a printed wiring board.

BACKGROUND ART

Patent Literature 1 discloses a cured product formed by curing an epoxy resin composition. This epoxy resin composition includes, as essential components, an epoxy resin and a predetermined polyvalent hydroxyl resin curing agent. The content of naphthol monomers in this polyvalent hydroxyl resin is 0.8 wt % or less, and the Gardner color scale of a 10 wt % methyl ethyl ketone solution of the polyvalent hydroxyl resin is 13 or less.

A cured coating having a desired pattern is formed on each surface of a substrate of a printed wiring board, for example, by applying a liquid photosensitive resist, or attaching a film (dry film) of a photosensitive resist, onto each surface thereof, and then exposing both of these surfaces to a type of radiation (hereinafter referred to as a "double-sided exposure process").

According to this double-sided exposure process, each surface is irradiated with an ultraviolet ray through a photomask. In that case, so-called "unintentional back surface exposure" causes a problem. Specifically, the unintentional back surface exposure refers to a phenomenon that an ultraviolet ray, irradiating one side of a substrate, is transmitted through the inside of the substrate to have an unintentional part of a photosensitive resist exposed to the ultraviolet ray. This problem has become increasingly aggravated as the thicknesses of substrates have been further reduced lately, and is still difficult to solve even when the substrate is made of the cured product of Patent Literature 1, for example.

CITATION LIST

Patent Literature

Patent Literature 1: JP 2001-261785 A

SUMMARY OF INVENTION

It is therefore an object of the present disclosure to provide a thermosetting resin composition, from which a cured product with excellent UV shielding ability may be obtained, a prepreg, a metal-clad laminate, a printed wiring board, a film with resin, and metal foil with resin.

A thermosetting resin composition according to an aspect of the present disclosure contains a thermosetting resin and an inorganic filler. The thermosetting resin includes a curing agent. A 3 mass % methyl ethyl ketone solution of the curing agent has a Gardner color scale of 15 or more. The content of the curing agent accounts for 10 mass % or more of a total solid content of the thermosetting resin composition.

A prepreg according to another aspect of the present disclosure includes: a base member; and a semi-cured product of the thermosetting resin composition impregnated into the base member.

A metal-clad laminate according to still another aspect of the present disclosure includes: an insulating layer formed out of a cured product of the prepreg; and at least one metal layer formed on either or both surfaces of the insulating layer.

A printed wiring board according to yet another aspect of the present disclosure includes: an insulating layer formed out of a cured product of the prepreg; and conductor wiring formed on either or both surfaces of the insulating layer.

DESCRIPTION OF EMBODIMENTS (1) Overview

Figure 1:
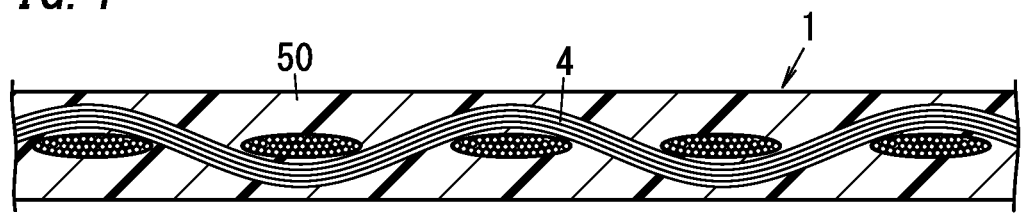
FIG. 1 is a schematic cross-sectional view of a prepreg according to an exemplary embodiment of the present disclosure.

A thermosetting resin composition according to an exemplary embodiment contains a thermosetting resin and an inorganic filler. The thermosetting resin includes a curing agent. A 3 mass % methyl ethyl ketone solution of the curing agent has a Gardner color scale of 15 or more. The content of the curing agent accounts for 10 mass % or more of a total solid content of the thermosetting resin composition.

According to this embodiment, the curing agent absorbs an ultraviolet ray easily, and the thermosetting resin composition contains a predetermined amount of such a curing agent. This provides a cured product with excellent UV shielding ability.

(2) Details

(2.1) Thermosetting Resin Composition

A thermosetting resin composition according to this embodiment contains a thermosetting resin and an inorganic filler. The thermosetting resin and the inorganic filler are essential components. The thermosetting resin composition may further contain optional components other than these essential components to the extent that the effect achieved by the essential components is not ruined. These essential and optional components will be described in detail one by one.

(2.1.1) Thermosetting Resin

The thermosetting resin is a low-molecular compound having a reactive group (such as a prepolymer or oligomer). When the thermosetting resin is heated, a crosslinking reaction (curing reaction) thereof proceeds, thus turning the thermosetting resin into an insoluble and infusible substance (cured product) with a three-dimensional structure.

Specific examples of the thermosetting resin include epoxy resins, bismaleimide resins, phenolic resins and cyanate resins.

Specific examples of the epoxy resin include triphenylmethane type epoxy resins, biphenyl aralkyl type epoxy resins, naphthalene type epoxy resins, phenol novolac type epoxy resins, cresol novolac type epoxy resins, and dicyclopentadiene-containing phenol novolac type epoxy resins. If the thermosetting resin is an epoxy resin, the epoxy equivalent thereof suitably falls within the range from 158 g/eq to 275 g/eq, and more suitably falls within the range from 158 g/eq to 235 g/eq. Making the epoxy equivalent of the thermosetting resin fall within one of these ranges increases the crosslink density and eventually increases the glass transition temperature (Tg) of the cured product. Increasing Tg improves the dimensional stability and heat resistance reliability of the cured product.

A bismaleimide resin may provide a cured product having higher heat resistance than an epoxy resin.

The thermosetting resin includes a curing agent. In this embodiment, a 3 mass % methyl ethyl ketone solution of the curing agent has a Gardner color scale of 15 or more. In this case, the Gardner color scale may be determined by a Gardner color scale testing method. The definition of the Gardner color scale and its testing method are compliant with the JIS K 0071-2 standard.

That is to say, the Gardner color scale refers to the color scale to be determined by comparing the color transmitted through a sample with the color transmitted through a Gardner color scale standard solution. The Gardner color scale standard solution may be prepared using potassium hexachloroplatinate (IV), iron (III) chloride, cobalt (II) chloride, and hydrochloric acid. The Gardner color scale is indicated as a color scale falling within the range from 1 to 18. The color of a sample is represented by a single integer, as a matter of principle. If the color of a sample is an intermediate color between two Gardner color scale standard solutions as an exception, then a Gardner color scale closest to the color of the sample is determined, and the color of sample is expressed as being "brighter" or "darker" than the color scale. Optionally, the Gardner color scale standard solutions may be replaced with standard color glass plates with the same colors as the ones transmitted.

This sample is the 3 mass % methyl ethyl ketone solution of the curing agent. That is to say, this sample is prepared by dissolving the curing agent in the methyl ethyl ketone solution as a solvent such that the curing agent as a solute has a concentration of 3 mass %.

In the following description, a curing agent, of which the 3 mass % methyl ethyl ketone solution has a Gardner color scale of 15 or more, may be hereinafter referred to as a "first curing agent" and curing agents other than the first curing agent may be hereinafter referred to as "second curing agents." That is to say, the 3 mass % methyl ethyl ketone solution of the second curing agent has a Gardner color scale falling within the range from 1 to 14. In the following description, the Gardner color scale refers to the Gardner color scale of the 3 mass % methyl ethyl ketone solution unless otherwise stated.

The first curing agent has a Gardner color scale of 15 or more (the upper limit of which is 18). Thus, when contained in the thermosetting resin composition, the first curing agent imparts excellent UV shielding ability to the cured product. That is to say, the first curing agent forms the cured product through crosslinking reaction, but a part derived from the first curing agent of the cured product is able to absorb an ultraviolet ray. The second curing agent does not impart as high UV shielding ability as the first curing agent to the cured product. Nevertheless, the second curing agent may be used in combination with the first curing agent.

The content of the first curing agent accounts for 10 mass % or more of a total solid content of the thermosetting resin composition. Setting the content of the first curing agent at 10 mass % or more provides a cured product with excellent UV shielding ability. For example, if an insulating layer is formed out of such a cured product, an ultraviolet ray irradiating one surface of the insulating layer will be absorbed into the insulating layer, thus shielding the other surface from the ultraviolet ray and reducing the chances of the ultraviolet ray being transmitted through the other surface.

The ultraviolet ray falls within a wavelength range in which the photosensitive resist is sensitive to an exposing radiation. For example, the ultraviolet ray may have a wavelength falling within the range from 350 nm to 450 nm. If the content of the first curing agent is less than 10 mass %, then the cured product would have declined UV shielding ability. If the insulating layer is formed out of such a cured product, part of the ultraviolet ray irradiating one surface of the insulating layer would be absorbed into the insulating layer but the rest of the ultraviolet ray could be transmitted through the other surface.

As can be seen, adding the first curing agent, which absorbs an ultraviolet ray more easily than the second curing agent, at a content of 10 mass % or more to the thermosetting resin composition provides a cured product with excellent UV shielding ability.

Specific examples of the first curing agent include naphthalene type phenolic resins and novolac type phenolic resins.

The naphthalene type phenolic resin includes, in a single molecule, at least one naphthalene ring and at least one benzene ring. The naphthalene rings, benzene rings, or a naphthalene ring and a benzene ring are connected together with a divalent organic group (such as a methylene group ($-CH_2-$). In this naphthalene type phenolic resin, each naphthalene ring has at least one hydroxyl group ($-OH$), and each benzene ring has at least one hydroxyl group (phenolic hydroxyl group).

In other words, the naphthalene type phenolic resin suitably includes, in a single molecule, at least one naphthol skeleton and at least one phenol skeleton. The naphthol skeleton is expressed by the following Formula (A) or the following Formula (C). The naphthol skeleton is a skeleton in which one or more hydrogen atoms in the naphthalene ring are replaced with hydroxyl group(s). The phenol skeleton is expressed by the following Formula (B). The phenol skeleton is a skeleton in which one or more hydrogen atoms in the benzene ring are replaced with hydroxyl group(s).

[Chemical Formula 1]

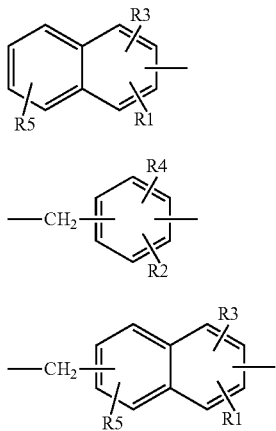

In Formulae (A) and (C), each of R1, R3, and R5 is a hydrogen atom (H), a methyl group (—$CH_3$), a methoxy group (—$OCH_3$), or a hydroxyl group, and at least one of R1, R3 or R5 is a hydroxyl group. In Formula (B), each of R2 and R4 is a hydrogen atom, a methyl group or a hydroxyl group, and at least one of R2 or R4 is a hydroxyl group. Note that one line segment in Formula (A) and two line segments in Formulae (B) and (C) each represent bonds to other structural sites.

Since the naphthalene type phenolic resin has a naphthalene ring, a conjugated system thereof is larger than that of the novolac type phenolic resin with a benzene ring. Therefore, the absorption peak wavelength of the naphthalene type phenolic resin is longer than the absorption peak wavelength of the novolac type phenolic resin. That is to say, the naphthalene type phenolic resin absorbs an ultraviolet ray more easily than a novolac type phenolic resin. Thus, it is recommended that the first curing agent contain the naphthalene type phenolic resin.

Adding the naphthalene type phenolic resin to the first curing agent increases Tg of the cured product, thus improving the heat resistance and flame resistance of the cured product. This further reduces the hygroscopicity and thermal expansion coefficient of the cured product as well.

The naphthalene type phenolic resin is suitably expressed by the following Formula (D). The naphthalene type phenolic resin includes the naphthol skeleton expressed by Formulae (A) and (C), and the phenol skeleton expressed by Formula (B).

[Chemical Formula 2]

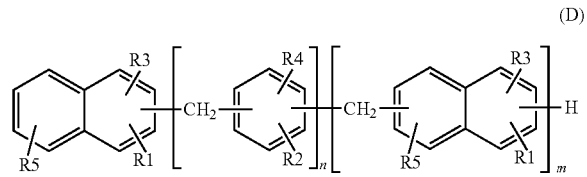

In Formula (D), each of R1, R3, and R5 is a hydrogen atom, a methyl group, a methoxy group, or a hydroxyl group, and at least one of R1, R3, or R5 is a hydroxyl group. Also, in Formula (D), each of R2 and R4 is a hydrogen atom, a methyl group or a hydroxyl group, and at least one of R2 or R4 is a hydroxyl group.

In Formula (D), n is an integer falling within the range from 1 to 3, and m is an integer falling within the range from 0 to 3. In the naphthalene type phenolic resin expressed by Formula (D), the order of arrangement of the phenol skeleton expressed by Formula (B) and the naphthol skeleton expressed by Formula (C) is not particularly limited. That is to say, in the naphthalene type phenolic resin expressed by Formula (D), the phenol skeletons expressed by Formula (B) may or may not be continuous with each other. Also, the naphthol skeletons expressed by Formula (C) may or may not be continuous with each other. In short, the naphthalene type phenolic resin expressed by Formula (D) may have one naphthol skeleton expressed by Formula (A), and n phenol skeletons expressed by Formula (B), and m naphthol skeleton expressed by Formula (C).

The naphthalene type phenolic resin is suitably expressed by the following Formula (E). The naphthalene type phenolic resin is a specific example of the naphthalene type phenolic resin expressed by Formula (D).

[Chemical Formula 3]

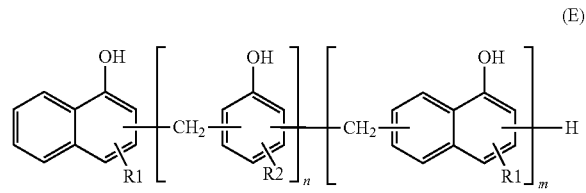

In Formula (E), R1 is a hydrogen atom, a methyl group or a methoxy group. In Formula (E), R2 is a hydrogen atom or a methyl group. In Formula (E), n is an integer falling within the range from 1 to 3, and m is an integer falling within the range from 0 to 3.

Furthermore, the naphthalene type phenolic resin is suitably oxidized. More specifically, the hydroxyl group that the naphthalene ring included in the naphthalene type phenolic resin has is suitably oxidized. When oxidized, the hydroxyl group turns into an oxo group (=O).

For example, the oxidized naphthalene type phenolic resin has a naphthoquinone skeleton. The naphthoquinone skeleton has, for example, 1,4-naphthoquinone skeleton expressed by the following Formula (F), and 1,2-naphthoquinone skeleton expressed by the following Formula (G).

[Chemical Formula 4]

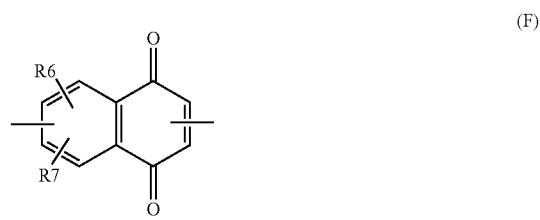

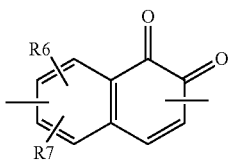

(G)

In Formulae (F) and (G), each of R6 and R7 is a hydrogen atom, a methyl group, an ethyl group (—CH$_2$CH$_3$), or a methoxy group. Note that two line segments in Formulae (F) and (G) represent bonds to other structural sites.

An oxidized naphthalene type phenolic resin suitably has at least one of the 1,4-naphthoquinone skeleton expressed by Formula (F) or the 1,2-naphthoquinone skeleton expressed by Formula (G). Such an oxidized naphthalene type phenolic resin is obtained, for example, by subjecting the naphthalene type phenolic resin expressed by Formula (D) or (E) to oxidation treatment. Exemplary methods of oxidation treatment include: (1) putting a naphthalene-type phenolic resin into a non-sealed container and either leaving or stirring the naphthalene-type phenolic resin in the container in the presence of the air; (2) putting a naphthalene-type phenolic resin into a non-sealed container and either leaving or stirring the naphthalene-type phenolic resin in the container while blowing oxygen into the container; and (3) confining a naphthalene-type phenolic resin, along with the air, into a sealed container and either leaving or stirring the naphthalene-type phenolic resin and the air. The oxidation treatment temperature falls within the range from 50° C. to 100° C., for example. The oxidation treatment duration falls within the range from 6 hours to 72 hours, for example.

Oxidizing the naphthalene-type phenolic resin further lengthens the absorption peak wavelength.

The curing agent contained in the thermosetting resin composition is suitably the first curing agent alone, but may also be both the first curing agent and the second curing agent.

The thermosetting resin suitably further contains a reactive flame retardant. The reactive flame retardant forms a crosslinked structure when the thermosetting resin composition cures. Specific examples of the reactive flame retardant include phosphorus-modified phenolic resins, tetrabromobisphenol A, and tribromophenol. The reactive flame retardant is not present in an isolated form (i.e., by itself) in a cured product, but participates in the formation of a crosslinked structure. Thus, the reactive flame retardant improves the flame resistance (flame retardance) of the cured product while reducing a bleed-out phenomenon.

The reactive flame retardant is suitably a reactive phosphorus-based flame retardant. Using a reactive phosphorus-based flame retardant instead of a halogen allows a halogen-free thermosetting resin composition to be obtained. Specific examples of the reactive phosphorus-based flame retardants include a phosphorus-modified phenolic resin. If the reactive phosphorus-based flame retardant is a phosphorus-modified phenolic resin, then the hydroxyl equivalent thereof suitably falls within the range from 350 g/eq to 600 g/eq, and more suitably falls within the range from 373 g/eq to 550 g/eq.

(2.1.2) Inorganic Filler

An inorganic filler may contribute to improving the dimensional stability of a cured product of a thermosetting resin composition. Specific examples of the inorganic filler include fused silica, aluminum hydroxide, magnesium hydroxide, E glass powder, aluminum oxide, magnesium oxide, titanium dioxide, potassium titanate, calcium silicate, calcium carbonate, clay and talc. Among other things, fused silica and aluminum hydroxide are suitably used.

The fused silica has a spherical shape, and therefore, ensures sufficient moldability even when its content to the thermosetting resin composition is relatively significant. In addition, the fused silica may contribute to lowering the thermal expansion coefficient of the cured product, and improving the laser machinability, the drill machinability, and dimensional stability. Nevertheless, if the content of the fused silica is excessive, then the moldability of the thermosetting resin composition could decline. Furthermore, the fused silica is harder than aluminum hydroxide. Thus, when the content of the fused silica is excessive, the laser machinability and drill machinability of the cured product could decline.

Aluminum hydroxide could contribute to improving the flame resistance of the cured product. Nevertheless, if the content of the aluminum hydroxide is excessive, then the moldability of the thermosetting resin composition could decline and its cured product could absorb moisture more easily, compared to when the same content of fused silica is used.

Optionally, fused silica and aluminum hydroxide may be used in combination.

Alternatively, only fused silica may be selectively used, of these two components. In these cases, the percentage of the fused silica to the total mass of the fused silica and the aluminum hydroxide suitably falls within the range from 50 mass % to 100 mass %. When the content of the fused silica is such an optimum one, the advantages of the fused silica and the aluminum hydroxide are both achieved. That is to say, the thermal expansion coefficient of the cured product may be lowered and the flame resistance, laser machinability, and drill machinability are all improvable.

The inorganic filler suitably has a mean particle size falling within the range from 0.5 μm to 5 μm. As used herein, the "mean particle size" refers to a particle size (d50) at a cumulative value of 50% in a particle size distribution measured by the laser diffraction and scattering method.

The content of the inorganic filler is suitably 200 parts by mass or less relative to 100 parts by mass of the thermosetting resin. Setting the content of the inorganic filler at 200 parts by mass or less improves the moldability of the thermosetting resin composition. This further reduces production of voids in the cured product of the thermosetting resin composition. The content of the inorganic filler is suitably 50 parts by mass or more relative to 100 parts by mass of the thermosetting resin.

(2.1.3) Optional Components

Specific examples of the optional components include core-shell rubber, an acrylic resin, an additive flame retardant, and a curing accelerator. These components will be described one by one in this order.

The thermosetting resin composition suitably contains either the core-shell rubber or the acrylic resin or both of the core-shell rubber and the acrylic resin.

First, the core-shell rubber will be described. The core-shell rubber is a collection of rubber particles with a core-shell structure. Each rubber particle is made up of a core and a shell. At least one of the core or the shell has elasticity. Adding such core-shell rubber to the thermosetting resin composition improves the impact resistance, thermal impact resistance, laser machinability, and drill machinability of the cured product. The core-shell rubber suitably includes silicone in at least one of the core or the shell, thus further improving the thermal impact resistance. That is to say, compared to a situation where no silicone is contained, the impact resistance is improvable at lower temperatures.

The core is rubber in the shape of a particle. The rubber may be a copolymer or a homopolymer, whichever is appropriate. Specifically, the copolymer may be a silicone/acrylic copolymer. Specifically, the homopolymer may be a crosslinked acrylic polymer. The crosslinked acrylic polymer is a homopolymer of an acrylic monomer and has a three-dimensional crosslinked structure.

The shell is present on the surface of the core. The shell consists of a plurality of graft chains. One end of each graft chain is a fixed end which is coupled to the surface of the core, while the other end thereof is a free end. The graft chain may be a copolymer or a homopolymer, whichever is appropriate. Specifically, the copolymer may be an acrylonitrile/styrene copolymer. Specifically, the homopolymer may be poly(methyl methacrylate).

The mean particle size of the core-shell rubber suitably falls within the range from 0.1 μm to 0.7 μm. Setting the mean particle size of the core-shell rubber at 0.1 μm or more further improves the impact resistance of the cured product. Setting the mean particle size of the core-shell rubber at 0.7 μm or less allows the core-shell rubber to be uniformly dispersed in the thermosetting resin composition more easily, and therefore, tends to be uniformly dispersed in the cured product as well.

The content of the core-shell rubber suitably falls within the range from 10 parts by mass to 30 parts by mass relative to 100 parts by mass of the thermosetting resin. Setting the content of the core-shell rubber at a value falling within this range improves the impact resistance, drill machinability, and laser machinability of the cured product while maintaining appropriate moldability for the thermosetting resin composition.

Next, the acrylic resin will be described. The acrylic resin has structures expressed by at least Formulae (2) and (3), respectively, among the following Formulae (1), (2), and (3). In the following description, an acrylic resin with such a structure will be described. However, this is only an example and should not be construed as limiting.

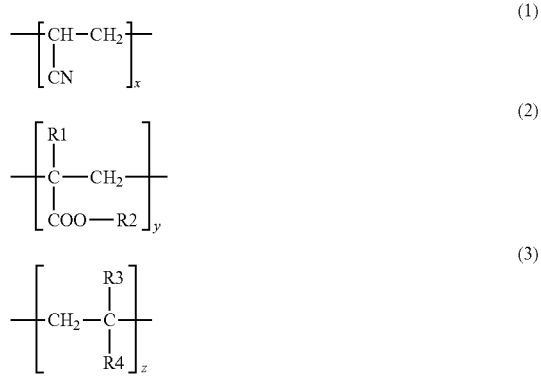

x in Formula (1), y in Formula (2), and z in Formula (3) satisfy the following relation x:y:z (in mole fractions)=0: 0.95:0.05 to 0.2:0.6:0.2 (where x+y+z≤1, 0≤x≤0.2, 0.6≤y≤0.95, and 0.05≤z≤0.2). In Formula (2), R1 is either a hydrogen atom or a methyl group and R2 is selected from the group consisting of a hydrogen atom, an alkyl group, a glycidyl group, and an epoxidized alkyl group and includes at least one of the glycidyl group or the epoxidized alkyl group. In Formula (3), R3 is either a hydrogen atom or a methyl group, and R4 is a phenyl group (-Ph), —COOCH$_2$Ph, or —COO(CH$_2$)$_2$Ph.

The main chain of the acrylic resin has structures expressed by at least Formulae (2) and (3), respectively, among these Formulae (1), (2), and (3).

If the main chain of the acrylic resin has structures expressed by Formulae (1), (2) and (3), respectively, the order of arrangement of the respective structures expressed by Formulae (1), (2), and (3) is not particularly limited. In that case, in the main chain of the acrylic resin, the structures expressed by Formula (1) may or may not be continuous with each other, the structures expressed by Formula (2) may or may not be continuous with each other, and the structures expressed by Formula (3) may or may not be continuous with each other.

If the main chain of the acrylic resin has structures expressed by Formulae (2) and (3), respectively, the order of arrangement of the respective structures expressed by Formulae (2) and (3) is not particularly limited. In that case, in the main chain of the acrylic resin, the structures expressed by Formula (2) may or may not be continuous with each other, and the structures expressed by Formula (3) may or may not be continuous with each other.

The significance of R2 in Formula (2) including at least one of a glycidyl group or an epoxidized alkyl group among a hydrogen atom, an alkyl group, the glycidyl group, and the epoxidized alkyl group will be described as a supplement. The premise is that R2 in the structure expressed by the single Formula (2) is a single ingredient. In the following description, a situation where the acrylic resin has one structure expressed by Formula (2) and a situation where the acrylic resin has two or more structures expressed by Formula (2) will be described separately.

In the former case, i.e., if the acrylic resin has one structure expressed by single Formula (2), R2 is either a glycidyl group or an epoxidized alkyl group.

In the latter case, i.e., if the acrylic resin has structures expressed by two or more Formulae (2), respectively, then R2 in the structure expressed by at least one Formula (2) is either a glycidyl group or an epoxidized alkyl group, while R2 in the structures expressed by the other Formula (or Formulae) (2) is either a hydrogen atom or an alkyl group. Since R2 in the structure expressed by at least one Formula (2) is either a glycidyl group or an epoxidized alkyl group, R2 in the structures expressed by all Formulae (2) may also be either a glycidyl group or an epoxidized alkyl group.

The structure expressed by Formula (3) includes a phenyl group (-Ph), —COOCH$_2$Ph, or —COO(CH$_2$)$_2$Ph. -Ph, —COOCH$_2$Ph, and —COO(CH$_2$)$_2$Ph are thermally stable enough to increase the strength of a cured product of the prepreg. This increases the moisture-heat resistance of the metal-clad laminate 2 and printed wiring board 3 (hereinafter collectively referred to as "substrates") fabricated using the prepreg as a material.

The acrylic resin suitably has no unsaturated bonds (which may be double bonds or triple bonds) between adjacent carbon atoms. That is to say, in the acrylic resin, adjacent carbon atoms are suitably bonded together with a saturated bond (single bond). This reduces oxidation with time, thus reducing an increase in brittleness due to the loss of elasticity.

The acrylic resin has a weight average molecular weight (Mw) falling within the range from 200,000 to 850,000. If the weight average molecular weight of the acrylic resin is equal to or greater than 200,000, then the chemical resistance of the cured product improves. Also, if the weight average molecular weight of the acrylic resin is equal to or less than 850,000, then the moldability of the thermosetting resin composition improves.

Adding the acrylic resin to the thermosetting resin composition decreases the moisture absorption of the cured product of the prepreg, thus increasing the moisture resistance of the substrates and eventually improving the insulation reliability. In addition, even if the cured product of the prepreg absorbs moisture, the moisture-heat resistance of the substrates is still improvable, because the breaking strength of the resin that forms part of the cured product has been increased.

The acrylic resin is a prepolymer having at least one epoxy group in a single molecule. The epoxy group is one kind of functional group contained in the acrylic resin. The equivalent of the epoxy group in the acrylic resin suitably falls within the range from 1,250 g/eq to 100,000 g/eq, and more suitably falls within the range from 2,500 g/eq to 7,000 g/eq. As used herein, the equivalent of the epoxy group means the mass of the acrylic resin including one equivalent of the epoxy group. The smaller the equivalent of the epoxy group is, the higher the concentration of the epoxy group is. The larger the equivalent of the epoxy group is, the lower the concentration of the epoxy group is.

The content of the acrylic resin suitably falls within the range from 10 parts by mass to 30 parts by mass relative to 100 parts by mass of the thermosetting resin. Setting the content of the acrylic resin at 10 parts by mass or more improves the degree of adhesion of the cured product to a metal. In addition, setting the content of the acrylic resin at 30 parts by mass or less makes the cured product less flammable.

Optionally, the core-shell rubber and the acrylic resin may be used in combination. Alternatively, only the core-shell rubber may be used, out of these two components. In any of these cases, the percentage of the core-shell rubber to the total mass of the core-shell rubber and the acrylic resin suitably falls within the range from 50 mass % to 100 mass %. When the content of the core-shell rubber is such an optimum one, the advantages of the core-shell rubber and the acrylic resin are both achieved. That is to say, the impact resistance, thermal impact resistance, laser machinability, and drill machinability of the cured product and the degree of adhesion of the cured product to a metal are all improvable.

Next, the additive flame retardant will be described. Specific examples of the additive flame retardant include phosphoric acid ester compounds, phosphazene compounds, and antimony oxide. Adding the additive flame retardant to the thermosetting resin composition improves the flame resistance of the cured product.

The additive flame retardant is suitably an additive phosphorus-based flame retardant. Using an additive phosphorus-based flame retardant instead of a halogen allows a halogen-free thermosetting resin composition to be obtained. Specific examples of the additive phosphorus-based flame retardants include phosphoric acid ester compounds, phosphazene compounds, phosphite compounds, phosphine compounds, phosphinate compounds, polyphosphate compounds, phosphonium salt compounds and phosphine oxide compounds.

Next, the curing accelerator will be described. An appropriate curing accelerator may be selected according to the thermosetting resin and curing agent used. Specifically, the curing accelerator may be 2-ethyl-4-methyl imidazole, for example.

Next, optional components which are suitably not contained in the thermosetting resin composition will be described.

The thermosetting resin composition suitably contains substantially no pigments or dyes. Some pigments and dyes are able to absorb an ultraviolet ray. However, if at least one of a pigment or a dye is substantially contained in the thermosetting resin composition, the following problems could arise.

In general, no pigments or dyes have a crosslinking point reactive to a thermosetting resin, and therefore, are unable to form a crosslinked structure. That is why if an excessive pigment or an excessive dye is contained in the cured product 51, then the heat resistance of the cured product 51 could decline.

In addition, if the pigment exhibits poor dispersivity in a solvent, then the cured product 51 could not be colored uniformly. That is to say, in that case, the pigment would be locally aggregated on the surface of the cured product 51. This local aggregation produces shading, thus making the cured product 51 colored non-uniformly.

Furthermore, if the dye exhibits poor dissolvability in a solvent, then the cured product 51 could not be colored uniformly. That is to say, in that case, the dye would locally precipitate on the surface of the cured product 51. This local precipitation produces shading, thus making the cured product 51 colored non-uniformly.

Furthermore, if the density of the conductor wiring 81 of the printed wiring board 3 further increases, then adjacent parts of the conductor wiring 81 could be electrically insulated insufficiently. Such an insufficient electrical insulation could be caused by a short-circuit between the adjacent parts of the conductor wiring 81 due to the presence of an aggregated electrically conductive pigment, such as carbon black, between the adjacent parts of the conductor wiring 81, for example.

In contrast, according to this embodiment, when the thermosetting resin composition cures, the first curing agent that absorbs an ultraviolet ray forms a cross-linked structure and is not present in an isolated form (i.e., by itself) in the cured product, thus reducing the chances of causing such a problem. Optionally, unless the UV shielding effect is not ruined, the thermosetting resin composition may contain at least one of a pigment or a dye.

In addition, the thermosetting resin composition suitably contains substantially no halogens. If the thermosetting resin composition is halogen-free, then generation of dioxins is reducible when a printed wiring board including the cured product is burned. To impart flame resistance to the cured product, the thermosetting resin composition may contain a phosphorus-containing flame retardant instead of halogens, as described above. Optionally, the thermosetting resin composition may contain a very small amount of halogens unless the UV shielding effect is ruined and as long as the generation of dioxins is reducible.

(2.2) Prepreg

A prepreg 1 according to this embodiment is shown in FIG. 1. The prepreg 1 is in the shape of a sheet or a film as a whole. The prepreg 1 may be used as a material for a metal-clad laminate 2, a material for a printed wiring board 3, and to form a printed wiring board 3 with a multilayer structure (by a build-up process).

The prepreg 1 includes a base member 4 and a semi-cured product 50 of a thermosetting resin composition impregnated into the base member 4.

Specifically, the base member 4 may be a woven fabric or a nonwoven fabric, whichever is appropriate. Specifically, the woven fabric may be a piece of glass cloth. Specifically, the non-woven fabric may be glass non-woven fabric. The glass cloth and the glass non-woven fabric are usually made of glass fibers but may also be made any other type of reinforced fibers instead of glass fibers. Specific examples of the reinforced fibers include aromatic polyamide fibers, liquid crystal polyester fibers, poly(praraphenylene benzobisoxazole) (PBO) fibers, and polyphenylene sulfide (PPS) resin fibers.

A sheet or film of the prepreg 1 includes at least one base member 4.

A semi-cured product 50 is a semi-cured one of the thermosetting resin composition. As used herein, the "semi-cured" state refers to an intermediate stage (Stage B) of a curing reaction. The intermediate stage is a stage between a stage in the state of a varnish (Stage A) and a stage in a fully cured state (Stage C). Heating the prepreg 1 allows the prepreg 1 to melt once and then be cured fully to turn into a cured product. The cured product of the prepreg 1 may form an insulating layer of the substrates.

The prepreg 1 suitably has a thickness of 100 μm or less, more suitably has a thickness of 60 μm or less, and even more suitably has a thickness of 40 μm or less. This reduces the thickness of the insulating layer, thus realizing a substrate with a reduced thickness. The prepreg 1 suitably has a thickness of at least 10 μm.

(2.3) Metal-Clad Laminate

Figure 2:
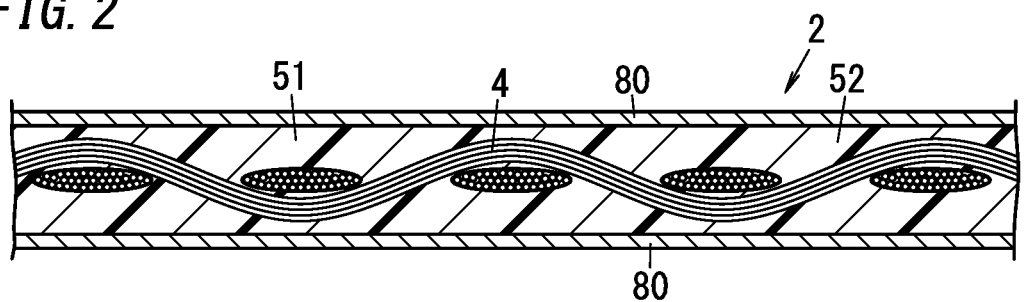
FIG. 2 is a schematic cross-sectional view of a metal-clad laminate according to the exemplary embodiment of the present disclosure.

A metal-clad laminate 2 according to this embodiment is shown in FIG. 2. The metal-clad laminate 2 includes an insulating layer 52 and metal layers 80. The metal-clad laminate 2 may be used as a material for the printed wiring board 3, for example.

The insulating layer 52 is made of a cured product 51 of the prepreg 1. Although the insulating layer 52 includes a single base member 4 in the example illustrated in FIG. 2, the insulating layer 52 may include two or more base members 4. The thickness of the insulating layer 52 is not particularly limited. A thick insulating layer 52 is effective in improving the UV shielding ability, while a thin insulating layer 52 is effective in reducing the thickness of the substrate. To satisfy these two requirements, the thickness of the insulating layer 52 is suitably 100 μm or less, more suitably 60 μm or less, and even more suitably 40 μm or less. The first curing agent contributes significantly to improvement of the UV shielding ability. Nevertheless, as it is also effective to ensure some thickness for the insulating layer 52, the thickness of the insulating layer 52 is suitably at least 10 μm, and more suitably 15 μm or more.

The metal layer 80 is formed on either or both surfaces of the insulating layer 52. Specifically, the metal layer 80 may be a copper layer, for example. In the example illustrated in FIG. 2, the metal layer 80 is formed on each of the two surfaces of the insulating layer 52. However, this is only an example and should not be construed as limiting. Alternatively, the metal layer 80 may also be formed on only one surface of the insulating layer 52. The metal-clad laminate 2 including the metal layer 80 on each of two surfaces of the insulating layer 52 is called a "double-sided metal-clad laminate." The metal-clad laminate 2 including the metal layer 80 on only one surface of the insulating layer 52 is called a "single-sided metal-clad laminate."

(2.4) Printed Wiring Board

Figure 3:
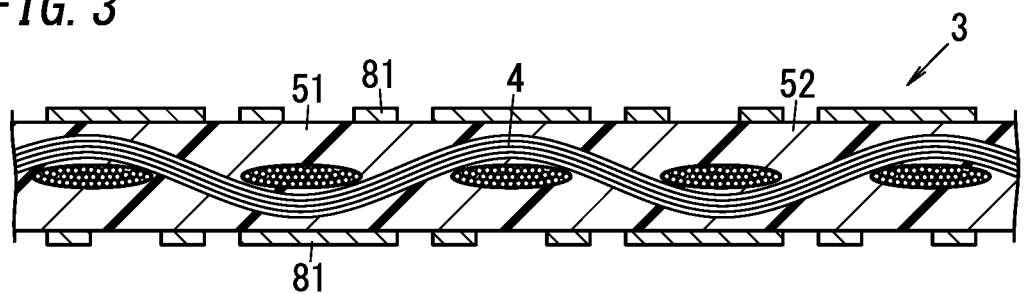
FIG. 3 is a schematic cross-sectional view of a printed wiring board according to the exemplary embodiment of the present disclosure.

A printed wiring board 3 according to this embodiment is shown in FIG. 3. The printed wiring board 3 includes the insulating layer 52 and conductor wiring 81. As used herein, the "printed wiring board" refers to a board which includes only wiring and to which no electronic parts have been soldered yet.

The insulating layer 52 is made of a cured product 51 of the prepreg 1. The insulating layer 52 may be the same as the insulating layer 52 of the metal-clad laminate 2 described above.

The conductor wiring 81 is formed on either or both surfaces of the insulating layer 52. In FIG. 3, the conductor wiring 81 is formed on each of the two surfaces of the insulating layer 52. However, this is only an example and should not be construed as limiting. Alternatively, the conductor wiring 81 may be formed on only one surface of the insulating layer 52.

Next, a method for manufacturing the printed wiring board 3 will be described. Specifically, this is a method for patterning the metal-clad laminate 2 shown in FIG. 2 into the printed wiring board 3 shown in FIG. 3. The printed wiring board 3 may be manufactured by removing unnecessary portions of the metal layers 80 of the metal-clad laminate 2. Necessary portions of the metal layer 80 to be left after the unnecessary portions thereof have been removed will constitute conductor wiring 81.

Figure 4A:
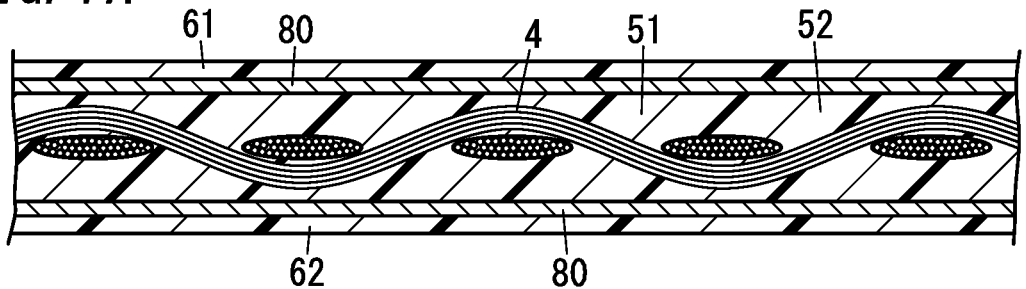
FIGS. 4A-4D are cross-sectional views illustrating respective process steps of a method for manufacturing the printed wiring board.

First, as shown in FIG. 4A, a first etching resist 61 is applied or attached onto one metal layer 80 of the metal-clad laminate 2, and a second etching resist 62 is applied or attached onto the other metal layer 80. In the following example, the first etching resist 61 and the second etching resist 62 are supposed to be negative photoresists. However, this is only an example and should not be construed as limiting. Alternatively, the first etching resist 61 and the second etching resist 62 may be positive photoresists as well.

Figure 4B:
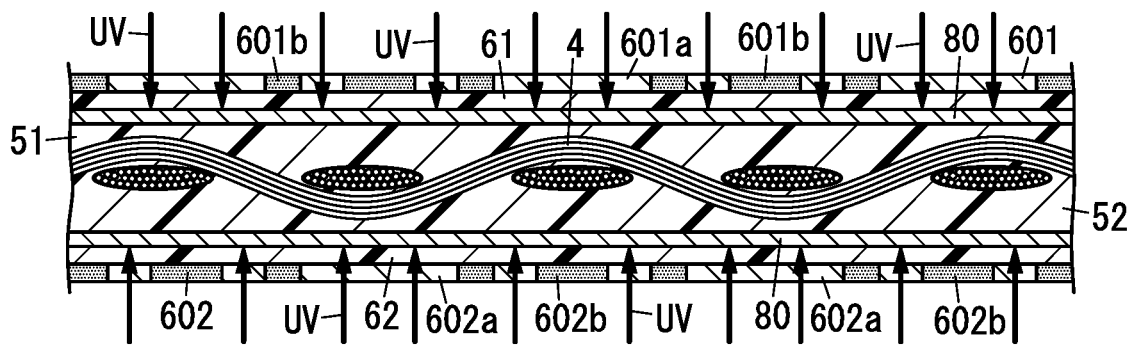

Next, as shown in FIG. 4B, a first photomask 601 is stacked on the first etching resist 61, and a second photomask 602 is stacked on the second etching resist 62.

In this case, the first photomask 601 includes light-transmitting portions 601a and opaque portions 601b. Likewise, the second photomask 602 also includes light-transmitting portions 602a and opaque portions 602b.

Then, a double-sided exposure process is carried out. Specifically, each of the first photomask 601 and the second photomask 602 is exposed to an ultraviolet ray UV.

In the first photomask 601, the ultraviolet ray UV is transmitted through the light-transmitting portions 601a thereof but is cut off by the opaque portions 601b thereof. Portions, irradiated with the ultraviolet ray UV that has been transmitted through the light-transmitting portions 601a, of the first etching resist 61 are caused to cure through photo-polymerization to form a first resist layer 61a.

In this case, even if the ultraviolet ray UV is transmitted through the first etching resist 61, the ultraviolet ray UV is reflected from the metal layer 80 that is present beyond the first etching resist 61. Thus, this does not cause the so-called "unintentional back surface exposure" problem.

Meanwhile, in the second photomask 602, the ultraviolet ray UV is transmitted through the light-transmitting portions 602a thereof but is cut off by the opaque portions 602b thereof. Portions, irradiated with the ultraviolet ray UV that has been transmitted through the light-transmitting portions 602a, of the second etching resist 62 are caused to cure through photo-polymerization to form a second resist layer 62a.

In this case, even if the ultraviolet ray UV is transmitted through the second etching resist 62, the ultraviolet ray UV is reflected from the metal layer 80 that is present beyond the second etching resist 62. Thus, this does not cause the so-called "unintentional back surface exposure" problem.

Figure 4C:
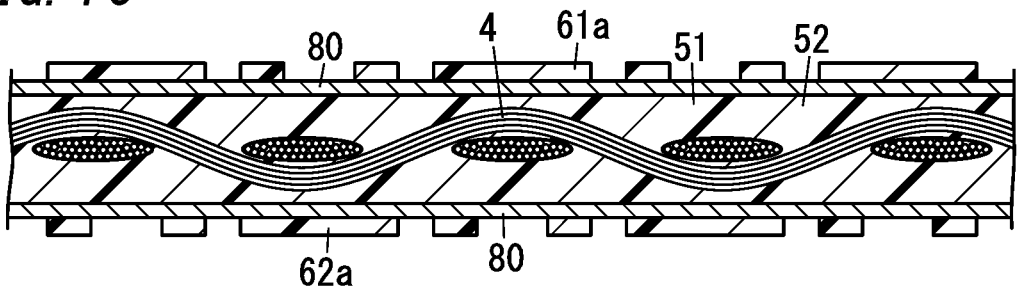

Next, as shown in FIG. 4C, portions, which have not been irradiated with the ultraviolet ray UV, of the first etching resist 61 and the second etching resist 62 are removed with a developer. At this time, the first resist layer 61a and the second resist layer 62a are not dissolved in the developer but left. The rest of the etching resists 61 and 62, other than the first resist layer 61a and the second resist layer 62a, are dissolved in the developer and removed.

Figure 4D:
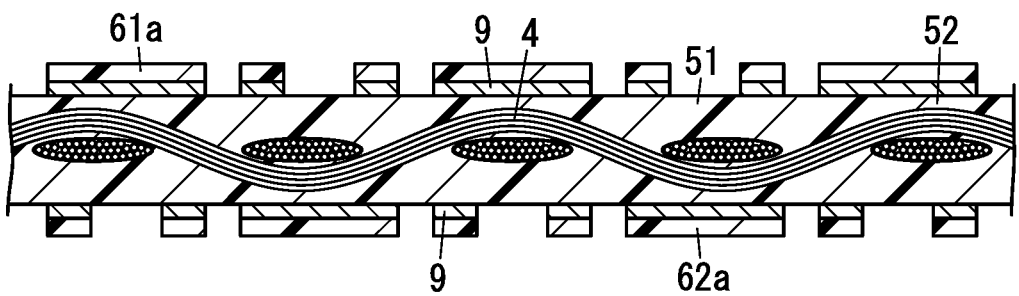

Thereafter, as shown in FIG. 4D, portions, not protected by the first resist layer 61a or the second resist layer 62a, of each of the metal layers 80 are removed with an etchant.

After that, the first resist layer 61a and the second resist layer 62a are removed with a stripping solution, thus completing the printed wiring board 3 shown in FIG. 3.

(2.5) Coated Printed Wiring Board

Next, a method for manufacturing a coated printed wiring board 30 will be described. Specifically, this is a method for patterning the printed wiring board 3 shown in FIG. 3 into the coated printed wiring board 30 shown in FIG. 5C.

Figure 5A:
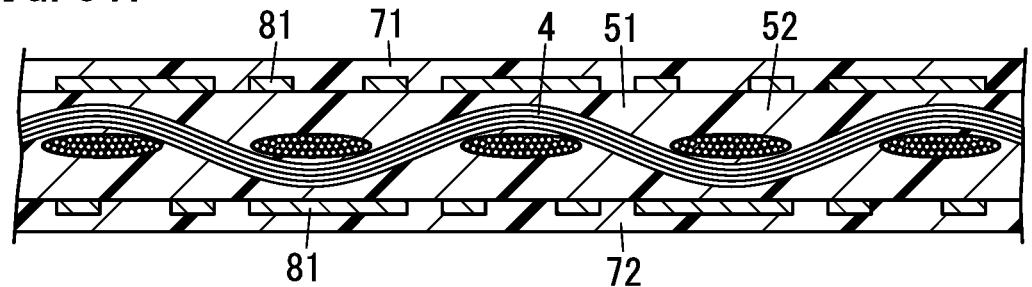
FIGS. 5A-5C are cross-sectional views illustrating respective process steps of a method for manufacturing a coated printed wiring board.

First, as shown in FIG. 5A, a first solder resist 71 is applied or attached onto one surface of the printed wiring board 3, and a second solder resist 72 is applied or attached onto the other surface thereof. In the following example, the first solder resist 71 and the second solder resist 72 are supposed to be negative solder resists. However, this is only an example and should not be construed as limiting. Alternatively, the first solder resist 71 and the second solder resist 72 may be positive solder resists as well.

Figure 5B:
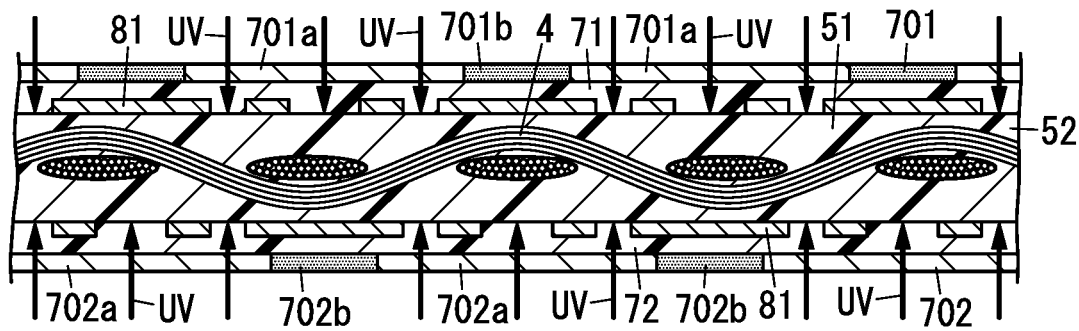

Next, as shown in FIG. 5B, a first photomask 701 is stacked on the first solder resist 71, and a second photomask 702 is stacked on the second solder resist 72.

In this case, the first photomask 701 includes light-transmitting portions 701a and opaque portions 701b. Likewise, the second photomask 702 also includes light-transmitting portions 702a and opaque portions 702b.

Then, a double-sided exposure process is carried out. Specifically, each of the first photomask 701 and the second photomask 702 is exposed to an ultraviolet ray UV.

In the first photomask 701, the ultraviolet ray UV is transmitted through the light-transmitting portions 701a thereof but is cut off by the opaque portions 701b thereof. Portions, irradiated with the ultraviolet ray UV that has been transmitted through the light-transmitting portions 701a, of the first solder resist 71 are caused to cure through photo-polymerization to form a first resist layer 71a.

In this case, in a region where the conductor wiring 81 is present between the first solder resist 71 and the insulating layer 52, even if the ultraviolet ray UV is transmitted through the first solder resist 71, the ultraviolet ray UV is reflected from the conductor wiring 81 that is present beyond the first solder resist 71.

On the other hand, in a region where no conductor wiring 81 is present between the first solder resist 71 and the insulating layer 52, the ultraviolet ray UV is transmitted through the first solder resist 71 to irradiate the insulating layer 52. In this case, the insulating layer 52 is made of the cured product 51 of the prepreg 1, and therefore, has excellent UV shielding ability. That is why even the ultraviolet ray UV that has been transmitted through the light-transmitting portions 701a of the first photomask 701 and then through the first solder resist 71, if any, is cut off by the insulating layer 52. This reduces the chances of the ultraviolet ray UV being transmitted through the insulating layer 52 to reach and cause exposure of the second solder resist 72 on the opposite side. That is to say, this reduces the so-called "unintentional back surface exposure."

Meanwhile, in the second photomask 702, the ultraviolet ray UV is transmitted through the light-transmitting portions 702a thereof but is cut off by the opaque portions 702b thereof. Portions, irradiated with the ultraviolet ray UV that has been transmitted through the light-transmitting portions 702a, of the second solder resist 72 are caused to cure through photo-polymerization to form a second resist layer 72a.

In this case, in a region where the conductor wiring 81 is present between the second solder resist 72 and the insulating layer 52, even if the ultraviolet ray UV is transmitted through the second solder resist 72, the ultraviolet ray UV is reflected from the conductor wiring 81 that is present beyond the second solder resist 72.

On the other hand, in a region where no conductor wiring 81 is present between the second solder resist 72 and the insulating layer 52, the ultraviolet ray UV is transmitted through the second solder resist 72 to irradiate the insulating layer 52. In this case, the insulating layer 52 is made of the cured product 51 of the prepreg 1, and therefore, also has excellent UV shielding ability. That is why even the ultraviolet ray UV that has been transmitted through the light-transmitting portions 702a of the second photomask 702 and then through the second solder resist 72, if any, is cut off by the insulating layer 52. This reduces the chances of the ultraviolet ray UV being transmitted through the insulating layer 52 to reach and cause exposure of the first solder resist 71 on the opposite side. That is to say, this reduces the so-called "unintentional back surface exposure."

Figure 5C:
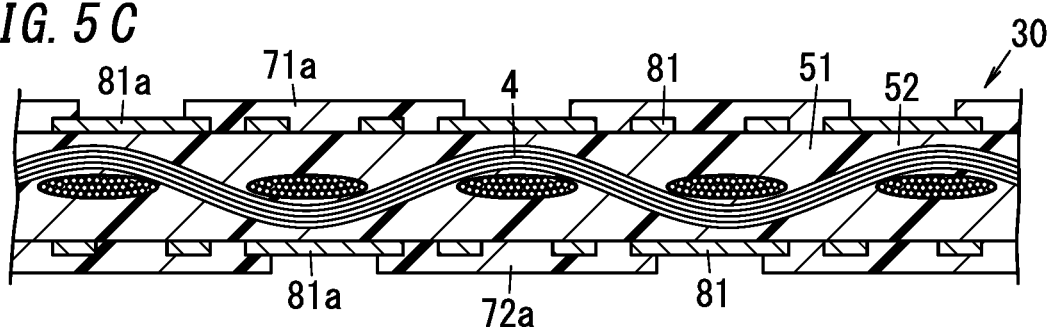

Next, as shown in FIG. 5C, portions, which have not been irradiated with the ultraviolet ray UV, of the first solder resist 71 and the second solder resist 72 are removed with a developer. At this time, the first resist layer 71a and the second resist layer 72a are not dissolved in the developer but left. The rest of the solder resists 71 and 72, other than the first resist layer 71a and the second resist layer 72a, are dissolved in the developer and removed.

In this manner, a coated printed wiring board 30 is obtained. Portions, not protected by the first resist layer 71a or the second resist layer 72a, of the conductor wiring 81 may serve as pads 81a, to which electronic parts (not shown) may be soldered.

Note that a printed circuit board is a board that is enabled to operate as an electronic circuit by soldering electronic parts to the pads 81a of the coated printed wiring board 30. Furthermore, a semiconductor package is obtained by encapsulating the electronic parts of the printed circuit board.

(2.6) Film with Resin

Figure 6A:
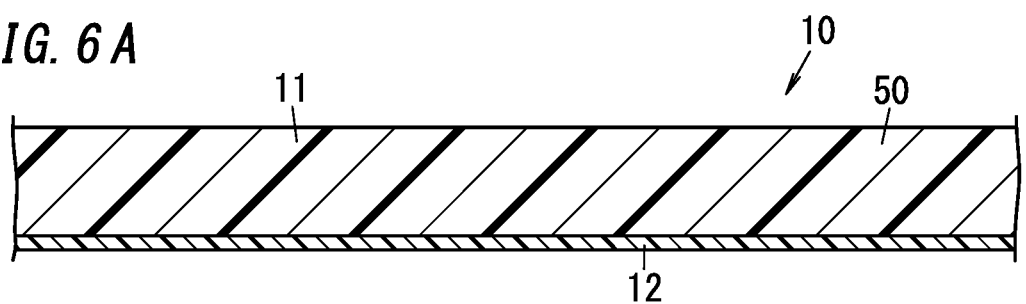
FIG. 6A is a schematic cross-sectional view of an exemplary film with resin according to the exemplary embodiment of the present disclosure.

A film 10 with resin according to this embodiment is shown in FIG. 6A. The film 10 with resin is in the shape of a film or a sheet as a whole. The film 10 with resin includes a resin layer 11 and a supporting film 12. The film 10 with resin may be used to form a printed wiring board 3 with a multilayer structure (by a build-up process), for example.

The resin layer 11 is made of a semi-cured product 50 of a thermosetting resin composition. By being heated, the semi-cured product 50 may turn into a cured product 51 with excellent UV shielding ability. In this manner, the resin layer 11 may constitute the insulating layer 52.

The resin layer 11 suitably has a thickness of 100 μm or less, more suitably has a thickness of 60 μm or less, and even more suitably has a thickness of 40 μm or less. This reduces the thickness of the insulating layer 52, and eventually reduces the overall thickness of the substrate. The resin layer 11 suitably has a thickness of at least 10 µm.

The supporting film 12 supports the resin layer 11. Supporting the resin layer 11 in this manner makes it easier to handle the resin layer 11 in a semi-cured state. The supporting film 12 may be an electrical insulating film. Specific examples of the supporting film 12 include a polyethylene terephthalate (PET) film, a polyimide film, a polyester film, a polyparabanic acid film, a polyether ether ketone film, a polyphenylene sulfide film, an aramid film, a polycarbonate film, and a polyarylate films. However, the supporting film 12 does not have to be any of these films. Optionally, a release agent layer (not shown) may be provided on one surface of the supporting film 12 on which the resin layer 11 is supported. The release agent layer makes the supporting film 12 peelable as needed from the resin layer 11. The supporting film 12 is suitably peeled from the insulating layer 52 after the insulating layer 52 has been formed.

Figure 6B:
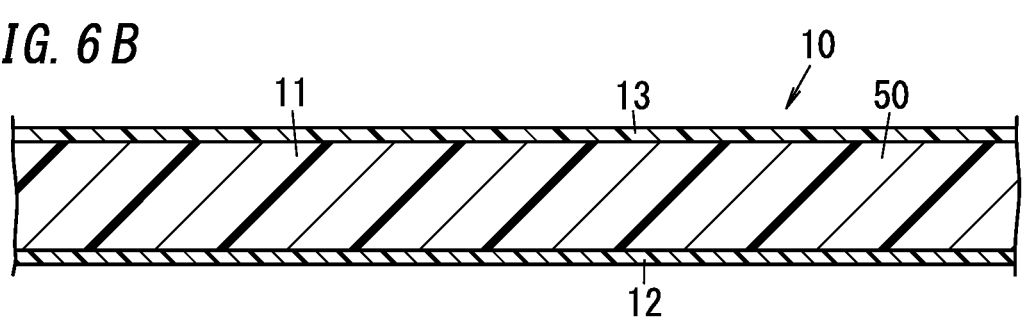
FIG. 6B is a schematic cross-sectional view of another exemplary film with resin according to the exemplary embodiment of the present disclosure.

In the example illustrated in FIG. 6A, one surface of the resin layer 11 is coated with the supporting film 12. Optionally, the other surface of the resin layer 11 may be coated with a protective film 13 as well, as shown in FIG. 6B. Coating both surfaces of the resin layer 11 in this manner makes it even easier to handle the resin layer 11 in a semi-cured state. In addition, this also reduces the chances of foreign substances being deposited on the resin layer 11. The protective film 13 may be an electrical insulating film, for example. Specific examples of the protective film 13 include a polyethylene terephthalate (PET) film, a polyolefin film, a polyester film, and a polymethylpentene film. However, the protective film 13 does not have to be any of these films. On one surface of the protective film 13 on which the protective film 13 is stacked on the resin layer 11, a release agent layer (not shown) may be provided. The release agent layer makes the protective film 13 peelable as needed from the resin layer 11.

(2.7) Sheet of Metal Foil with Resin

Figure 7:
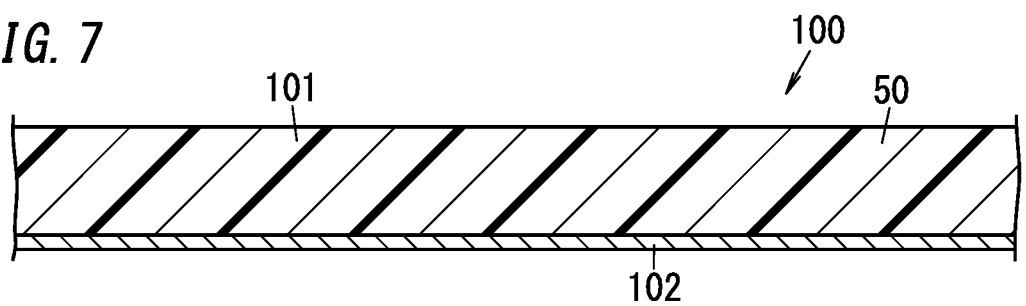
FIG. 7 is a schematic cross-sectional view of a sheet of metal foil with resin according to the exemplary embodiment of the present disclosure.

A sheet of metal foil 100 with resin according to this embodiment is illustrated in FIG. 7. The sheet of metal foil 100 with resin is in the shape of a film or a sheet as a whole. The sheet of metal foil 100 with resin includes a resin layer 101 and a sheet of metal foil 102. The sheet of metal foil 100 with resin may be used to form a printed wiring board 3 with a multilayer structure (by a build-up process), for example.

The resin layer 101 is made of a semi-cured product 50 of the thermosetting resin composition. By being heated, the semi-cured product 50 may turn into a cured product 51 with excellent UV shielding ability. In this manner, the resin layer 101 may constitute the insulating layer 52.

The resin layer 101 suitably has a thickness of 100 µm or less, more suitably has a thickness of 60 µm or less, and even more suitably has a thickness of 40 µm or less. This reduces the thickness of the insulating layer 52, and eventually reduces the overall thickness of the substrate. The resin layer 101 suitably has a thickness of at least 10 µm.

The resin layer 101 is adhered to the sheet of metal foil 102. Specifically, the sheet of metal foil 102 may be a sheet of copper foil, for example. By having its unnecessary portions removed by etching, the sheet of metal foil 102 may form the conductor wiring 81.

(3) Resume

As can be seen from the foregoing description, a thermosetting resin composition according to a first aspect contains a thermosetting resin and an inorganic filler. The thermosetting resin includes a curing agent. A 3 mass % methyl ethyl ketone solution of the curing agent has a Gardner color scale of 15 or more. The content of the curing agent accounts for 10 mass % or more of a total solid content of the thermosetting resin composition.

The first aspect provides a cured product (51) with excellent UV shielding ability.

In a thermosetting resin composition according to a second aspect, which may be implemented in conjunction with the first aspect, the curing agent includes a naphthalene type phenolic resin.

The second aspect facilitates absorption of an ultraviolet ray, compared to using a novolac type phenolic resin.

In a thermosetting resin composition according to a third aspect, which may be implemented in conjunction with the first or second aspect, the content of the inorganic filler is 200 parts by mass or less relative to 100 parts by mass of the thermosetting resin.

The third aspect improves the moldability of the thermosetting resin composition and also reduces production of voids in the cured product (51).

In a thermosetting resin composition according to a fourth aspect, which may be implemented in conjunction with any one of the first to third aspects, the thermosetting resin further contains a reactive flame retardant.

The fourth aspect improves the flame resistance of the cured product (51).

A thermosetting resin composition according to a fifth aspect, which may be implemented in conjunction with any one of the first to fourth aspects, further contains either core-shell rubber or an acrylic resin or both of the core-shell rubber and the acrylic resin.

The fifth aspect improves at least one of the impact resistance, thermal impact resistance, laser machinability, drill machinability, or degree of adhesion to a metal, of the cured product.

A thermosetting resin composition according to a sixth aspect, which may be implemented in conjunction with any one of the first to fifth aspects, further contains an additive flame retardant.

The sixth aspect further improves the flame resistance of the cured product (51).

A prepreg (1) according to a seventh aspect includes: a base member (4); and a semi-cured product (50) of the thermosetting resin composition according to any one of the first to sixth aspects, which is impregnated into the base member (4).

The seventh aspect provides a cured product (51) with excellent UV shielding ability.

A prepreg (1) according to an eighth aspect, which may be implemented in conjunction with the seventh aspect, has a thickness of 100 µm or less.

The eighth aspect provides a cured product (51) having a thickness of 100 µm or less and excellent UV shielding ability.

A metal-clad laminate (2) according to a ninth aspect includes: an insulating layer (52) formed out of a cured product (51) of the prepreg (1) according to the seventh or eighth aspect; and at least one metal layer (80) formed on either or both surfaces of the insulating layer (52).

The ninth aspect improves the UV shielding ability of the insulating layer (52).

A printed wiring board (3) according to a tenth aspect includes: an insulating layer (52) formed out of a cured product (51) of the prepreg (1) according to the seventh or eighth aspect; and conductor wiring (81) formed on either or both surfaces of the insulating layer (52).

The tenth aspect improves the UV shielding ability of the insulating layer (52).

A film with resin (10) according to an eleventh aspect includes: a resin layer (11) formed out of a semi-cured product (50) of the thermosetting resin composition according to any one of the first to sixth aspects; and a supporting film (12) supporting the resin layer (11).

The eleventh aspect provides a cured product (51) with excellent UV shielding ability.

A sheet of metal foil (100) with resin according to a twelfth aspect includes: a resin layer (101) formed out of a semi-cured product (50) of the thermosetting resin composition according to any one of the first to sixth aspects; and a sheet of metal foil (102) to which the resin layer (101) is bonded.

The twelfth aspect provides a cured product (51) with excellent UV shielding ability.

EXAMPLES

Next, the present disclosure will be described specifically by way of specific examples.

First to Thirteenth Examples and First to Fifth Comparative Examples

<Thermosetting Resin Composition>

The following components were provided as materials for the thermosetting resin composition:

(Thermosetting Resin)
  Triphenyl methane type epoxy resin (manufactured by Nippon Kayaku Co., Ltd.; product name: "EPPN-502H"; epoxy equivalent: 158 to 178 g/eq);
  Naphthalene type epoxy resin (manufactured by DIC Corporation; product name: "HP-9900"; epoxy equivalent: 272 g/eq);
  Naphthalene type epoxy resin (manufactured by DIC Corporation; product name: "HP-4710"; epoxy equivalent: 170 g/eq);
  Bismaleimide resin (manufactured by Nippon Kayaku Co., Ltd.; product name: "MIR-3000"; manufactured by Nippon Kayaku Co., Ltd.)

(Curing Agent: First Curing Agent)

The naphthalene type phenolic resin expressed by Formula (E) was put into a non-sealed container and the content in the container was stirred in the presence of the air. By adjusting the oxidation treatment temperature within the range from 50° C. to 100° C. and also adjusting the oxidation treatment duration within the range from 6 hours to 72 hours, the following two naphthalene type phenolic resins were obtained:
  Oxidized naphthalene type phenolic resin (hydroxyl equivalent: 153 g/eq; Gardner color scale: 18); and
  Oxidized naphthalene type phenolic resin (hydroxyl equivalent: 153 g/eq; Gardner color scale: 15).

(Curing Agent: Second Curing Agent)
  Novolac type phenolic resin (manufactured by DIC Corporation; product name: "TD-2090"; hydroxyl equivalent: 105 g/eq; Gardner color scale: 1 or less)
  Naphthalene type phenolic resin (manufactured by DIC Corporation; product name: "HPC-9500"; hydroxyl equivalent: 153 g/eq; Gardner color scale: 7)

Note that the Gardner color scale of the curing agent was obtained compliant with the JIS K 0072-2 standard by using a 3 mass % methyl ethyl ketone solution as a sample.

(Reactive Flame Retardant)
  Reactive phosphorus-based flame retardant (phosphorus-modified phenolic resin, manufactured by Dow Chemical Company; product name "XZ-92741"; hydroxyl equivalent: 550 g/eq)
  Reactive phosphorus-based flame retardant (phosphorus-modified phenolic resin, manufactured by DIC Corporation; product name "HPC-9080"; hydroxyl equivalent: 373 g/eq)

(Inorganic Filler)
  Fused silica (manufactured by Admatecs; product name "SC-2500SEJ"; mean particle size: 0.5 µm);
  Aluminum hydroxide (manufactured by Sumitomo Chemical Co., Ltd.; product name "C-301N"; mean particle size: 1.5 µm)
  Aluminum hydroxide (manufactured by Sumitomo Chemical Co., Ltd.; product name "CL-303"; mean particle size: 4 µm)

(Core-Shell Rubber)
  Core-shell rubber (manufactured by Mitsubishi Chemical Corporation; product name "SRK200A"; core: silicone/acrylic copolymer; shell: acrylonitrile/styrene; mean particle size: 0.15 µm)
  Core-shell rubber (manufactured by Aica Kogyo Co., Ltd.; product name "AC3816N"; core: crosslinked acrylic polymer; shell: polymethyl methacrylate; mean particle size: 0.5 µm)
  Core-shell rubber (manufactured by Aica Kogyo Co., Ltd.; product name "AC3364"; core: crosslinked acrylic polymer; shell: polymethyl methacrylate; mean particle size: 0.1 µm)

(Acrylic Resin)
  Acrylic resin (manufactured by Nagase ChemteX Corporation; product name: "SG-P3 Modified 197"; weight-average molecular weight: 700,000)

(Dye)
  Oil-soluble dye (manufactured by Chuo Synthetic Chemical Co., Ltd.; product name: "Oil Red 168")

(Curing Accelerator)
  2-ethyl-4-methyl imidazole (manufactured by Shikoku Chemicals Corporation; product name: "2E4MZ")

(Thermosetting Resin Composition)

The thermosetting resin, curing agent, inorganic filler, phosphorus-containing flame retardant, core-shell rubber, acrylic resin, and curing accelerator were compounded together at each of the ratios shown in the following Table 1. The resultant compound was diluted with a solvent such that the solid content concentration became 65 mass %. Then, the mixture was stirred up to have a uniform concentration, thus preparing a thermosetting resin composition. In the eighth example, a mixed solvent of toluene and methyl ethyl ketone (at a volume ratio of 1:10) was used as the solvent. In the other examples and comparative examples, only methyl ethyl ketone was used.

(Prepreg)

The thermosetting resin composition was impregnated into a piece of glass cloth (manufactured by Nitto Boseki Co., Ltd.; #1017 type; E glass) such that the cured product of the prepreg would have a thickness of 25 µm. The thermosetting resin composition impregnated into the piece of glass cloth was heated and dried by a non-contact type heating unit until the thermosetting resin composition turned semi-cured. The heating temperature was set at a value falling within the range from 130° C. to 140° C. In this manner, the solvent in the thermosetting resin composition was removed, thereby making a prepreg including the piece of glass cloth and the semi-cured product of the thermosetting resin composition impregnated into the piece of glass cloth. The resin content of the prepreg fell within the range of 68 mass % to 74 mass % relative to 100 mass % of the entire prepreg.

(Metal-Clad Laminate)

On each of the two surfaces of a single prepreg, an extremely thin sheet of copper foil, out of an extremely thin sheet of copper foil with a sheet of carrier foil (where the sheet of carrier foil had a thickness of 18 μm and the extremely thin sheet of copper foil had a thickness of 2 μm) was stacked and then formed under heat and pressure, thereby making a first double-sided metal-clad laminate including an insulating layer with a thickness of 25 μm. The forming process under heat and pressure was conducted at a temperature of 210° C. and a pressure of 4 MPa for 120 minutes.

On each of the two surfaces of a single prepreg, a sheet of copper foil (with a thickness of 12 μm) was stacked and then formed under heat and pressure, thereby making a second double-sided metal-clad laminate including an insulating layer with a thickness of 25 μm. The forming process under heat and pressure was conducted at a temperature of 210° C. and a pressure of 4 MPa for 120 minutes.

[Characteristic Evaluation]

The extremely thin sheets of copper foil were etched away from both surfaces of the first double-sided metal-clad laminate to leave only an insulating layer. Using this insulating layer as a sample, the UV shielding ability, moldability, heat resistance #1, and flame resistance thereof were evaluated.

Meanwhile, the heat resistance #2 was evaluated with the second double-sided metal-clad laminate used as a sample, from which none of the sheets of copper foil were removed from any of the two surfaces thereof.

<UV Shielding Rate>

A sample was interposed between an exposure machine (manufactured by Hitec; product number: "HTE-3000M"), and a UV illuminometer (manufactured by Orc Manufacturing Co., Ltd.; product number: "UV-M02", a light receiver "UV-42" (with a peak wavelength of 400 nm)) to measure, using the UV illuminometer, the transmittance of the ultraviolet ray emitted from the exposure machine, transmitted through the sample, and then irradiating the light receiver. Then, the UV shielding rate (%) was calculated by the following equation:

UV shielding rate (%)=100−transmittance

<Moldability>

The surface of the sample was observed with the naked eye to see if there were any deficiencies. In addition, a cross section of the sample was observed through a microscope to see if there were any voids. The dimensions of the sample were 410 mm×510 mm×25 μm (thickness). The moldability was graded based on the following criteria:

Grade A: having no deficiencies or voids;
Grade B: having at least deficiencies or voids within 10 mm from the outer peripheral edges of the sample (i.e., within an outer peripheral region); and
Grade C: having at least deficiencies or voids in a central region surrounded with the outer peripheral region or in both the central region and the outer peripheral region.

<Heat Resistance #1>

Tg of the sample was measured using a dynamic mechanical spectrometer (DMS6100 manufactured by SII Nanotechnology Inc.). In this case, Tg was a temperature at which tan δ became maximum in a chart showing a relationship between the dielectric loss tangent (tan δ) and the temperature, which was obtained during a temperature increase stage of the dynamic mechanical analysis. The dimensions of the sample were 5 mm×50 mm×25 μm (thickness). The measurement was carried out under the condition including a tensile mode as the deformation mode, a frequency of 10 Hz, and a temperature increase rate of 5° C./min.

<Heat Resistance #2>

Using a small-sized high-temperature chamber (manufactured by ESPEC Corporation; product name: STH-120), the heat resistance of the second double-sided metal-clad laminate was evaluated in compliance with the JIS C6481 standard. Specifically, the second double-sided metal-clad laminate was allowed to stand still for one hour in the small-sized high-temperature chamber, of which the temperature was set at 270° C., and then unloaded from the chamber and inspected to see if there was any delamination of the copper foil. The dimensions of the sample were 50 mm×50 mm×49 μm (thickness) (where the insulating layer had a thickness of 25 μm and the sheets of copper foil on both surfaces of the insulating layer each had a thickness of 12 μm).

<Flame Resistance>

The flame resistance of the sample was evaluated by an evaluation testing method compliant with the UL94 (flammability test of a plastic material) of the UL (Underwriters Laboratories, Inc.) standard.

TABLE 1

| | | Unit | Ex 1 | Ex 2 | Ex 3 | Ex 4 | Ex 5 | Ex 6 | Ex 7 | Ex 8 | Ex 9 | Ex 10 | Ex 11 | Ex 12 | Ex 13 |
|---|---|---|---|---|---|---|---|---|---|---|---|---|---|---|---|
| Thermosetting Resin | EPPN-502H | Parts by mass | 45.0 | 45.0 | 45.0 | 0 | 20.0 | 25.0 | 45.0 | 20.0 | 45.0 | 55.0 | 45.0 | 45.0 | 0 |
| | HP-9900 | | 0 | 0 | 0 | 45.0 | 0 | 0 | 0 | 0 | 0 | 0 | 0 | 0 | 10.0 |
| | HP-4710 | | 0 | 0 | 0 | 0 | 25.0 | 20.0 | 0 | 20.0 | 0 | 0 | 0 | 0 | 37.0 |
| | MIR-3000 | | 0 | 0 | 30.0 | 0 | 0 | 0 | 0 | 20.0 | 0 | 45.0 | 0 | 0 | 0 |
| Curing Agent | First curing agent Gardner color scale 18 | | 35.0 | 35.0 | 0 | 35.0 | 45.0 | 35.0 | 35.0 | 30.0 | 35.0 | 0 | 35.0 | 35.0 | 33.0 |
| | Gardner color scale 15 | | 0 | 0 | 0 | 0 | 0 | 0 | 0 | 0 | 0 | 0 | 0 | 0 | 0 |
| Second curing agent | TD-2090 (Gardner color scale ≤ 1) | | 0 | 0 | 0 | 0 | 0 | 0 | 0 | 0 | 0 | 0 | 0 | 0 | 0 |
| | HPC-9500 (Gardner color scale 7) | | 0 | 0 | 0 | 0 | 0 | 0 | 0 | 0 | 0 | 0 | 0 | 0 | 0 |
| Reactive flame retardant | XZ-92741 | | 20.0 | 20.0 | 25.0 | 20.0 | 0 | 20.0 | 20.0 | 0 | 20.0 | 0 | 20.0 | 20.0 | 20.0 |
| | HPC-9080 | | 0 | 0 | 0 | 0 | 10.0 | 0 | 0 | 10.0 | 0 | 0 | 0 | 0 | 0 |
| Inorganic filler | SC-2500SEJ | | 120.0 | 120.0 | 175.0 | 120.0 | 30.0 | 100.0 | 85.0 | 100.0 | 200.0 | 60.0 | 85.0 | 85.0 | 85.0 |
| | C-301N | | 0 | 0 | 15.0 | 0 | 20.0 | 0 | 15.0 | 20.0 | 0 | 20.0 | 25.0 | 25.0 | 15.0 |
| | CL-303 | | 0 | 0 | 0 | 0 | 0 | 0 | 0 | 0 | 0 | 20.0 | 0 | 0 | 0 |
| Core-shell rubber | SRK200A | | 0 | 0 | 0 | 0 | 0 | 0 | 30.0 | 0 | 0 | 0 | 0 | 0 | 30.0 |
| | AC3816N | | 0 | 0 | 0 | 0 | 0 | 20.0 | 0 | 0 | 0 | 0 | 0 | 0 | 0 |
| | AC3364 | | 0 | 0 | 0 | 0 | 0 | 0 | 0 | 0 | 0 | 0 | 0 | 10.0 | 0 |
| Acrylic resin | SG-P3 modified 197 | | 0 | 0 | 0 | 0 | 0 | 10.0 | 0 | 0 | 0 | 0 | 15.0 | 10.0 | 0 |
| Dye | Oil Red 168 | | 0 | 0 | 0 | 0 | 0 | 0 | 0 | 0 | 0 | 0 | 0 | 0 | 0 |
| Curing accelerator | 2E4MZ | | 0.030 | 0.030 | 0.030 | 0.030 | 0.030 | 0.030 | 0.030 | 0.030 | 0.030 | 0.030 | 0.030 | 0.030 | 0.030 |
| Total solid content of thermosetting resin composition | | Mass % | 220.0 | 220.0 | 290.0 | 220.0 | 150.0 | 230.0 | 230.0 | 220.0 | 300.0 | 200.0 | 225.0 | 230.0 | 230.0 |
| Content of first curing agent relative to total solid content of thermosetting resin composition | | | 15.9 | 15.9 | 10.3 | 15.9 | 30.0 | 15.2 | 15.2 | 13.6 | 11.7 | 22.5 | 15.6 | 15.2 | 14.3 |
| Thermosetting resin | | Parts by mass | 100.0 | 100.0 | 100.0 | 100.0 | 100.0 | 100.0 | 100.0 | 100.0 | 100.0 | 100.0 | 100.0 | 100.0 | 100.0 |
| Content of inorganic filler relative to 100 parts by mass of thermosetting resin | | | 120.0 | 120.0 | 190.0 | 120.0 | 50.0 | 100.0 | 100.0 | 120.0 | 200.0 | 100.0 | 110.0 | 110.0 | 100.0 |
| Evaluation results | UV shielding rate | % | 97 | 97 | 95 | 97 | 98 | 97 | 97 | 96 | 94 | 98 | 97 | 97 | 97 |
| | Moldability | — | A | A | A | A | A | A | A | A | B | A | A | A | A |
| | Heat resistance #1 (DMA Tg) | °C. | 260 | 265 | 260 | 260 | 265 | 260 | 250 | 270 | 260 | 275 | 250 | 250 | 250 |
| | Heat resistance #2 (270° C., 1 hr) | — | N/A | N/A | N/A | N/A | N/A | N/A | N/A | N/A | N/A | N/A | N/A | N/A | N/A |
| | Flame resistance | — | VTM-0 | VTM-0 | VTM-0 | VTM-0 | VTM-0 | VTM-0 | VTM-0 | VTM-0 | VTM-0 | VTM-0 | VTM-0 | VTM-0 | VTM-0 |

TABLE 2

|  |  |  | Unit | Cmp Ex 1 | Cmp Ex 2 | Cmp Ex 3 | Cmp Ex 4 | Cmp Ex 5 |
|---|---|---|---|---|---|---|---|---|
| Thermosetting resin | EPPN-502H |  | Parts by mass | 45.0 | 45.0 | 50.0 | 45.0 | 45.0 |
|  | HP-9900 |  |  | 0 | 0 | 0 | 0 | 0 |
|  | HP-4710 |  |  | 0 | 0 | 0 | 0 | 0 |
|  | MIR-3000 |  |  | 0 | 0 | 0 | 0 | 0 |
|  | Curing Agent | First curing agent | Gardner color scale 18 | 0 | 0 | 0 | 35.0 | 0 |
|  |  |  | Gardner color scale 15 | 0 | 0 | 20.0 | 0 | 0 |
|  |  | Second curing agent | TD-2090 (Gardner color scale ≤ 1) | 35.0 | 0 | 10.0 | 0 | 0 |
|  |  |  | HPC-9500 (Gardner color scale 7) | 0 | 35.0 | 0 | 0 | 35.0 |
|  | Reactive flame retardant | XZ-92741 |  | 20.0 | 20.0 | 20.0 | 20.0 | 20.0 |
|  |  | HPC-9080 |  | 0 | 0 | 0 | 0 | 0 |
| Inorganic filler |  | SC-2500SEJ |  | 120.0 | 120.0 | 150.0 | 0 | 90.0 |
|  |  | C-301N |  | 0 | 0 | 0 | 0 | 0 |
|  |  | CL-303 |  | 0 | 0 | 0 | 0 | 0 |
| Core-shell rubber |  | SRK200A |  | 0 | 0 | 0 | 0 | 0 |
|  |  | AC3816N |  | 0 | 0 | 0 | 20.0 | 20.0 |
|  |  | AC3364 |  | 0 | 0 | 0 | 0 | 0 |
| Acrylic resin |  | SG-P3 modified 197 |  | 0 | 0 | 0 | 10.0 | 10.0 |
| Dye |  | Oil Red 168 |  | 0 | 0 | 0 | 0 | 0 |
| Curing accelerator |  | 2E4MZ |  | 0.030 | 0.030 | 0.030 | 0.030 | 0.030 |
| Total solid content of thermosetting resin composition |  |  |  | 220.0 | 220.0 | 250.0 | 130.0 | 230.0 |
| Content of first curing agent relative to total solid content of thermosetting resin composition |  |  | Mass % | 0.0 | 0.0 | 8.0 | 26.9 | 0.0 |
| Thermosetting resin |  |  | Parts by mass | 100.0 | 100.0 | 100.0 | 100.0 | 100.0 |
| Content of inorganic filler relative to 100 parts by mass of thermosetting resin |  |  |  | 120.0 | 120.0 | 150.0 | 0.0 | 90.0 |
| Evaluation results | UV shielding rate |  | % | 80 | 85 | 88 | 98 | 98 |
|  | Moldability |  | — | A | A | A | A | A |
|  | Heat resistance #1 (DMA Tg) |  | °C. | 255 | 260 | 260 | 250 | 240 |
|  | Heat resistance #2 (270° C., 1 hr) |  | — | N/A | N/A | N/A | N/A | N/A |
|  | Flame resistance |  | — | VTM-0 | VTM-0 | VTM-0 | Burned | VTM-0 |

REFERENCE SIGNS LIST

1 Prepreg
2 Metal-Clad Laminate
3 Printed Wiring Board
4 Base Member
50 Semi-Cured Product
51 Cured Product
52 Insulating Layer
80 Metal Layer
81 Conductor Wiring

The invention claimed is:

1. A thermosetting resin composition containing a thermosetting resin and an inorganic filler,
the thermosetting resin including a curing agent,
the curing agent including a naphthalene type phenolic resin,
the naphthalene type phenolic resin having
one naphthol skeleton expressed by Formula (A),
one to three phenol skeletons expressed by Formula (B), and
zero to three naphthol skeletons expressed by Formula (C),
a 3 mass % methyl ethyl ketone solution of the curing agent having a Gardner color scale of 15 or more,
the content of the curing agent accounting for 10 mass % or more of a total solid content of the thermosetting resin composition;

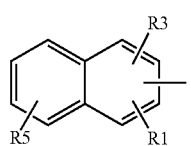

(A)

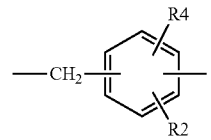

(B)

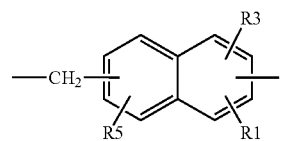

(C)

wherein in Formulae (A) and (C), each of R1, R3, and R5 is a hydrogen atom (H), a methyl group (—CH₃), a methoxy group (—OCH₃), or a hydroxyl group, and at least one of R1, R3 or R5 is a hydroxyl group; and in Formula (B), each of R2 and R4 is a hydrogen atom, a methyl group or a hydroxyl group, and at least one of R2 or R4 is a hydroxyl group.

2. The thermosetting resin composition of claim 1, wherein
the content of the inorganic filler is 200 parts by mass or less relative to 100 parts by mass of the thermosetting resin.

3. The thermosetting resin composition of claim 1, wherein
the thermosetting resin further contains a reactive flame retardant.

4. The thermosetting resin composition of claim 1, further containing either core-shell rubber or an acrylic resin or both of the core-shell rubber and the acrylic resin.

5. The thermosetting resin composition of claim 1, further containing an additive flame retardant.

6. A prepreg comprising:

a base member; and a semi-cured product of the thermosetting resin composition of claim 1, the semi-cured product being impregnated into the base member.

7. The prepreg of claim 6, wherein the prepreg has a thickness of 100 μm or less.

8. A metal-clad laminate comprising:

an insulating layer formed out of a cured product of the prepreg of claim 6; and at least one metal layer formed on either or both surfaces of the insulating layer.

9. A printed wiring board comprising:

an insulating layer formed out of a cured product of the prepreg of claim 6; and conductor wiring formed on either or both surfaces of the insulating layer.

10. A film with resin, comprising:

a resin layer formed out of a semi-cured product of the thermosetting resin composition of claim 1; and a supporting film supporting the resin layer.

11. A sheet of metal foil with resin, comprising:

a resin layer formed out of a semi-cured product of the thermosetting resin composition of claim 1; and a sheet of metal foil to which the resin layer is bonded.

\* \* \* \* \*